US008415811B2

(12) United States Patent
Fukumura et al.

(10) Patent No.: US 8,415,811 B2
(45) Date of Patent: Apr. 9, 2013

(54) SEMICONDUCTOR PACKAGE AND ELECTRONIC COMPONENT PACKAGE

(75) Inventors: Keiji Fukumura, Osaka (JP); Hironobu Agari, Osaka (JP); Kazuhiko Suzuki, Saitama (JP); Hideki Agari, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/280,705

(22) Filed: Oct. 25, 2011

(65) Prior Publication Data

US 2012/0104577 A1 May 3, 2012

(30) Foreign Application Priority Data

Nov. 2, 2010 (JP) ................................ 2010-246693

(51) Int. Cl.
*H01L 23/48* (2006.01)
*H01L 23/52* (2006.01)
*H01L 29/40* (2006.01)

(52) U.S. Cl. ...................................... 257/786; 257/778

(58) Field of Classification Search .................. 257/786, 257/778, 691, 784, 723, 724
See application file for complete search history.

(56) References Cited

U.S. PATENT DOCUMENTS

| 4,860,087 | A | * | 8/1989 | Matsubara et al. | 257/786 |
| 6,707,164 | B2 | * | 3/2004 | Cheng et al. | 257/786 |
| 2003/0042618 | A1 | * | 3/2003 | Nose et al. | 257/778 |
| 2005/0087888 | A1 | * | 4/2005 | Rosefield et al. | 257/786 |
| 2009/0261462 | A1 | * | 10/2009 | Gomez | 257/673 |

FOREIGN PATENT DOCUMENTS

| JP | 11-3916 | 1/1999 |
| JP | 2003-273154 | 9/2003 |
| JP | 2004-193475 | 7/2004 |
| JP | 2005-228811 | 8/2005 |
| JP | 2006-196922 | 7/2006 |
| JP | 2006-332708 | 12/2006 |

\* cited by examiner

*Primary Examiner* — S. V. Clark
(74) *Attorney, Agent, or Firm* — Cooper & Dunham LLP

(57) ABSTRACT

A semiconductor package includes an IC chip including a pad array having at least four pads, the pads including a voltage input pad and a voltage output pad disposed at edges of the pad array, a driver transistor disposed between the voltage input pad and the voltage output pad to receive an input voltage from the voltage input pad and output an output voltage to the voltage output pad, disposed in contact with an outer edge of the element arrangement region; and at least four leads on which the IC chip is mounted by flip chip bonding, disposed corresponding to the pads, formed in a lead array, the leads including a voltage input lead electrically connected to the voltage input pad and a voltage output lead electrically connected to the voltage output pad, disposed at edges of the lead array.

7 Claims, 6 Drawing Sheets

SEMICONDUCTOR PACKAGE AND ELECTRONIC COMPONENT PACKAGE

CROSS-REFERENCE TO RELATED APPLICATIONS

This patent application is based on and claims priority pursuant to 35 U.S.C. §119 to Japanese Patent Application No. 2010-246693, filed on Nov. 2, 2010, in the Japan Patent Office, the entire disclosure of which is hereby incorporated by reference herein.

BACKGROUND

1. Technical Field

The present disclosure relates to a semiconductor package and an electronic component package, and more particularly to a semiconductor package in which an IC chip mounting a driver transistor is mounted on leads by flip chip bonding and sealed with resin, and an electronic component package incorporating the semiconductor package.

2. Description of the Background Art

Conventionally, in semiconductor packages in which integrated circuit (IC) chips are sealed with resin, a wire-bonding technique is used to electrically connect pads of the IC chip and leads of the semiconductor packages.

Alternatively, there is also a flip chip bonding technique in which the IC chip is mounted in a device by using projecting solder terminals called bumps arranged in a grid array. Since the flip chip bonding technique can reduce the mounting area of the IC chip compared to the wire-bonding technique, the external dimensions of the semiconductor package can be downsized when the semiconductor package is assembled with the flip chip bonding.

There are ICs that have large mounting areas, such as voltage regulator ICs mounting a driver transistor and ICs mounting a power transistor. Herein, the term "large-area transistor" means, for example, a transistor constituting an analog circuit (e.g., a reference voltage generator, a differential amplification circuit, or a buffer circuit) and a transistor whose layout area of the transistor is greater than that of transistor used to configure a digital circuit. In a semiconductor package as proposed in JP-2005-228811-A, for example, an IC chip mounting a power transistor is mounted on a wire substrate (wiring patterns) using flip chip bonding.

However, the IC chip installing large-area transistors such as a driver transistor or a power transistor generate heat caused by the transistors, which is a problem.

In an effort to counteract this problem, in a configuration in which the pads of the IC chip and the leads of the semiconductor package are electrically connected by wire bonding as proposed in JP-2006-196922-A and JP-2006-332708-A, because the IC chip is mounted on a die pad, heat radiation can be improved by exposing the die pad outside an encapsulating resin.

By contrast, in the semiconductor package assembled with flip chip bonding, the IC chip is mounted on the leads in a state in which a pad formation face of the IC chip faces the package leads. Therefore, in order to improve heat radiation, in a semiconductor package like that proposed in JP-2005-228811-A, the IC chip is not sealed with resin but with a heat releasing member formed of metal material connected to a back face of the IC chip.

However, sealing the semiconductor package using metal material is more complicated than resin sealing, and consequently the cost manufacturing a metal material-sealed semiconductor package is higher than that for a resin-sealed semiconductor package.

BRIEF SUMMARY

In one aspect of this disclosure, there is a provided a semiconductor package assembled with flip chip bonding and sealed with resin, including an IC chip and at least four leads. The IC chip includes an element arrangement region, a pad array, and a driver transistor. The pad array has at least four pads including a voltage input pad to supply an input voltage and a voltage output pad to which an output voltage is supplied. The voltage input pad and the voltage output pad are disposed at edges of the pad array. The driver transistor is disposed between the voltage input pad and the voltage output pad to receive the input voltage from the voltage input pad and output the output voltage to the voltage output pad, and the driver transistor is disposed in contact with an edge of the element arrangement region. The at least four leads on which the IC chip is mounted by the flip chip bonding are disposed corresponding to the pads in the pad array and are formed in a lead array. The leads include a voltage input lead electrically connected to the voltage input pad and a voltage output lead electrically connected to the voltage output pad. The voltage input lead and the voltage output lead are disposed at edges of the lead array.

In another aspect of this disclosure, there is a provided an electronic component package including a printed circuit board having at least four wiring patterns and a semiconductor package mounted on the printed circuit board by flip chip bonding and sealed with resin. The semiconductor package includes the above-described IC chip and the above-described at least four leads.

BRIEF DESCRIPTION OF THE DRAWINGS

The aforementioned and other features, aspects and advantages of the present disclosure would be better understood by reference to the following detailed description when considered in connection with the accompanying drawings, wherein.

DETAILED DESCRIPTION OF PREFERRED EMBODIMENTS

Figure 1:
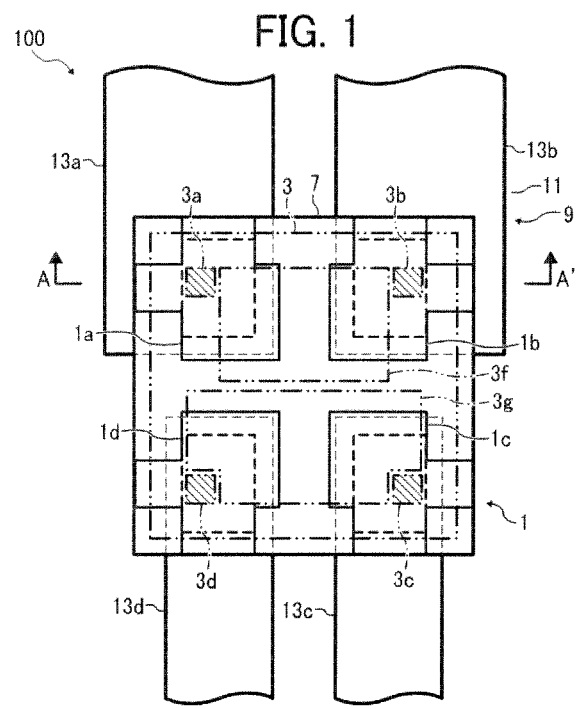
FIG. 1 is a plan view illustrating a semiconductor package in an electronic component package according to a first embodiment of the present disclosure.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Referring now to the drawings, wherein like reference numerals designate identical or corresponding parts throughout the several views, particularly to FIGS. 1 through 12, electronic component packages including semiconductor packages according to illustrative embodiments are described.

First Embodiment

A semiconductor package 1 mounted on an electronic component package 100 according to a first embodiment is described below with reference to FIGS. 1 through 7.

Figure 2:
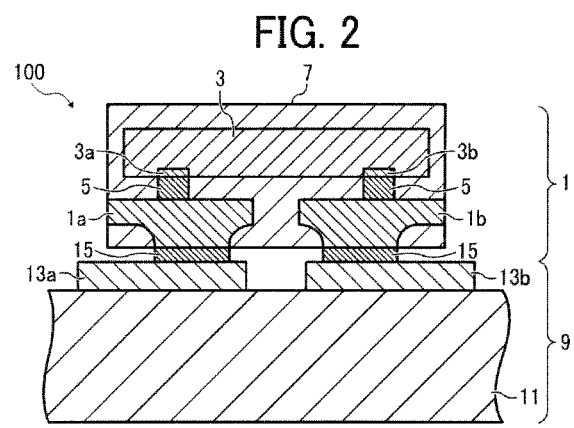
FIG. 2 is a cross-sectional diagram of the semiconductor package in the electronic component package along a line A-A' shown in FIG. 1.
Figure 3:
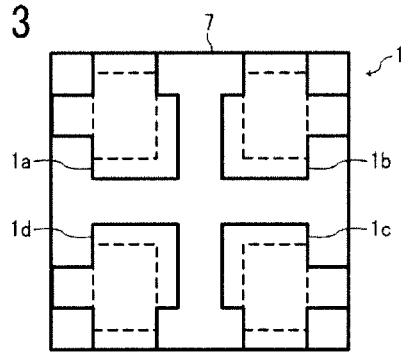
FIG. 3 is a top view illustrating an external outline of an encapsulating resin and leads in the semiconductor package in FIG. 1.
Figure 4:
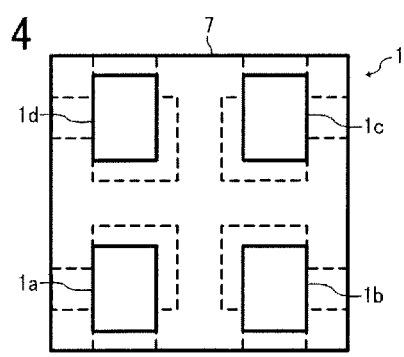
FIG. 4 is a bottom view illustrating the external outline of the encapsulating resin and the leads in the semiconductor package shown in FIG. 3.
Figure 5:
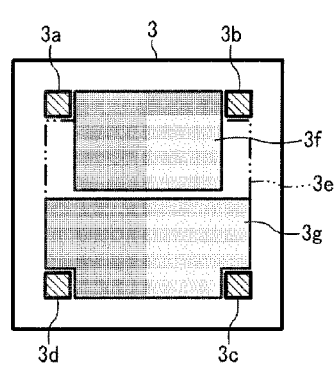
FIG. 5 is a plan view illustrating an external outline of an IC chip mounted in the semiconductor package, pads and an element arrangement region of the IC chip.
Figure 6:
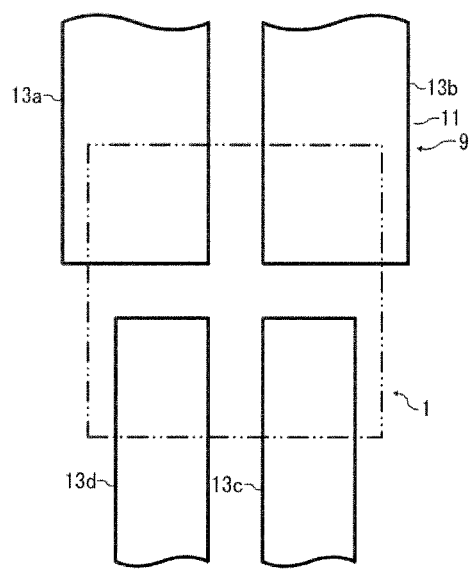
FIG. 6 is a plan view illustrating a printed circuit board in the electronic component package shown in FIG. 1.

FIG. 1 is a plan view illustrating the semiconductor package 1 and the electronic component package 100 according to the first embodiment. In FIG. 1, only an external outline of an encapsulating resin 7 of the semiconductor package 1 is represented, an integrated circuit (IC) chip is represented by a broken line, and figures of bumps and solder are omitted. FIG. 2 is a cross-sectional diagram of the semiconductor package 1 in the electronic component package 100 along a line A-A' shown in FIG. 1. FIG. 3 is a top view illustrating the external outline of the encapsulating resin 7 and leads 1a, 1b, 1c, and 1d in the semiconductor package 1. FIG. 4 is a bottom view illustrating the external outline of the encapsulating resin 7 and the leads 1a, 1b, 1c, and 1d in the semiconductor package 1. FIG. 5 is a plan view illustrating an external outline of an IC chip 3 mounted in the semiconductor package 1, pads 3a, 3b, 3c, and 3d, and an element arrangement region (element formation region) 3e of the IC chip 3. FIG. 6 is a plan view (bottom view) illustrating a printed circuit board 9 in the electronic component package 100 shown in FIG. 1.

As illustrated in FIG. 1, in the semiconductor package 1, the IC chip 3 is mounted on a lead frame (lead array) including four electrically separated leads 1a, 1b, 1c, and 1d via respective bumps 5 by flip chip bonding. The bumps 5 are formed of, for example, solder.

As illustrated in FIG. 5, the IC chip 3 is, for example, a power supply IC installing a voltage regulator, and the IC chip 3 includes the four pads 3a, 3b, 3c, and 3d and the element arrangement region 3e including a driver transistor 3f and an analog circuit forming region 3g. The pad 3a functions as a voltage input pad to supply an input voltage to the driver transistor 3f and supply a power supply voltage to an analog circuit formed in the analog circuit forming region 3g. The pad 3b functions as a voltage output pad to which an output voltage from the driver transistor 3f is supplied. The pad 3c functions as a ground pad that is connected to a ground voltage. The pad 3d functions as an enable-terminal pad to supply an enable signal to the analog circuit formed in the analog circuit forming region 3g.

The driver transistor 3f is disposed between the voltage input pad 3a and the voltage output pad 3b and is positioned in contact with an outer edge of the element arrangement region 3e. In this embodiment, the four pads 3a, 3b, 3c, and 3d are arranged in an array of two columns and two rows. The respective pads 3a, 3b, 3c, and 3d are arranged at edges the pad array.

In the semiconductor package 1, the pad 3a is connected to the lead 1a via the bump 5, the pad 3b is connected to the lead 1b via the bump 5, the pad 3c is connected to the lead 1c via the bump 5, and the pad 3d is connected to the lead 1d via the bump 5. In this embodiment, since the leads 1a, 1b, 1c, and 1d are arranged in an array of two columns and two rows, the respective leads 1a, 1b, 1c, and 1d are arranged at edges of the lead array.

The leads 1a, 1b, 1c, and 1d, the IC chip 3, and the bumps 5 are sealed with the encapsulating resin 7. The leads 1a, 1b, 1c, and 1d have steps in a backside face ("exposure face") opposite an IC chip mounting face that faces the IC chip 3, such that the leads 1a, 1b, 1c, and 1d are partially exposed outside the backside face (second face) of the encapsulating resin 7. The area of the leads 1a, 1b, 1c, and 1d in the IC chip mounting face (first face) is larger than the area of those leads in the exposure face (second face) in which the leads 1a, 1b, 1c, and 1d are exposed from the encapsulating resin 7, that is, the first face has a surface area larger than the second face. In addition, lateral faces of the leads 1a, 1b, 1c, and 1d are partially exposed at lateral faces of the encapsulating resin 7.

As illustrated in FIG. 2, the electronic component package 100 is formed by mounting the semiconductor package 1 on the printed circuit board 9. The printed circuit board 9 includes an insulative substrate 11 and wiring patterns 13a, 13b, 13c, and 13d formed on a surface of the insulative substrate 11. With reference to FIGS. 1, 2, and 6, upper ends of the wiring patterns 13a, 13b, 13c, and 13d are disposed at positions corresponding to the exposure faces of the leads 1a, 1b, 1c, and 1d of the semiconductor package 1. The lead (voltage input lead) 1a is connected to the wiring pattern (voltage input wiring pattern) 13a via solder 15, the lead (voltage output lead) 1b is connected to the wiring pattern (voltage output wiring pattern) 13b via the solder 15, the lead 1c is connected to the wiring pattern 13c via the solder 15, and the lead 1d is connected to the wiring pattern 13d via the solder 15. The voltage input wiring pattern 13a connected to the voltage input lead 1a and the voltage output wiring pattern 13b connected to the voltage output lead 1b have line widths that are wider than line widths of the wiring patterns 13c and 13d.

Figure 7:
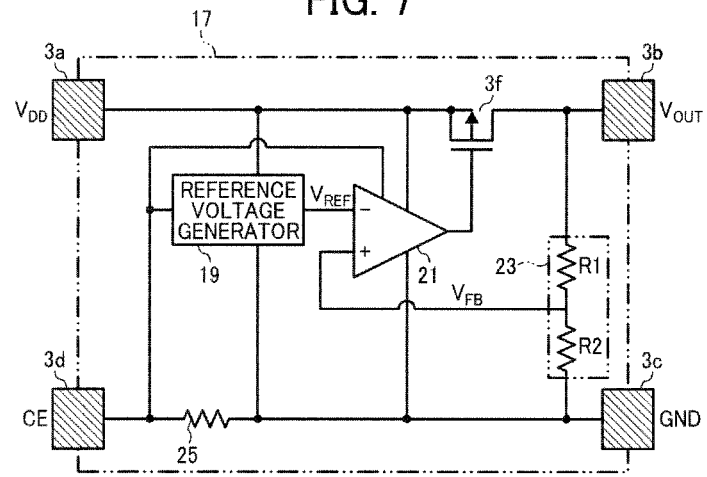
FIG. 7 is a block diagram illustrating a voltage regulator formed in the IC chip shown in FIG. 5.

FIG. 7 is a block diagram illustrating the voltage regulator formed in the IC chip 3 as a power supply IC. More specifically, the power supply IC (IC chip 3) includes a voltage regulator 17 to reliably supply a power supply voltage to a load. The voltage regulator 17 includes the voltage input pad 3a to which a direct voltage $V_{DD}$ from, for example a battery, is supplied, the voltage output pad 3b, connected to the load, to which a voltage output $V_{OUT}$ is supplied to the load, the ground pad 3c that is connected to a ground voltage GND, and the enable-terminal pad 3d to which an enable signal CE is input. The voltage regulator 17 further includes a reference voltage generator 19, a differential amplification circuit 21, the driver transistor 3f constituted by a positive channel metal oxide semiconductor (P-ch MOS) transistor, and a feedback resistance circuit 23 to generate a feedback voltage to a voltage supplied to the load. The circuits 19, 21, and 23 are formed on the analog circuit forming region 3g shown in FIG. 5.

The driver transistor 3f is disposed between the voltage input pad 3a and the voltage output pad 3b. The reference voltage generator 19 and the differential amplification circuit 21 are connected between the voltage input pad 3a and the ground pad 3c. The feedback resistance circuit 23 includes resistors R1 and R2 that are connected in series between the voltage output pad 3b and the ground pad 3c. The enable-terminal pad 3d is connected to the reference voltage generator 19 and the differential amplification circuit 21. The enable-terminal pad 3d is also connected to the ground pad 3c via a resistor 25. The resistor 25 is formed on the analog circuit forming region 3g shown in FIG. 5.

An output terminal of the differential amplification circuit 21 is connected to a gate terminal of the driver transistor 3f. A reference voltage $V_{REF}$ generated in the reference voltage generator 19 is input to an inverting input terminal (−) of the differential amplification circuit 21. A feed back voltage $V_{FB}$ generated in the feedback resistance circuit 23 is input to a non-inverting input terminal (+) of the differential amplification circuit 21. The differential amplification circuit 21 controls an output of the driver transistor 3f so that the feedback voltage $V_{FB}$ is identical to the reference voltage $V_{REF}$.

In the present embodiment, since the voltage input lead 1a and the voltage output lead 1b are arranged at the edges of the lead array, in the printed circuit board 9 on which the semiconductor package 1 is mounted, the line widths of the voltage input wiring pattern 13a that is connected to the voltage input lead 1a and the voltage output wiring pattern 13b that is connected to the voltage output lead 1b can be wider than those of other wiring patterns 13c and 13d.

Since the voltage input wiring pattern 13a and the voltage output wiring pattern 13b have the line widths that are wider than those of other wiring patterns 13c and 13d on the printed circuit board 9, a heat generated in the driver transistor 3f can be effectively released via the voltage input pad 3a and the voltage output pad 3b, and the voltage input wiring pattern 13a and the voltage output wiring pattern 13b, compared to a configuration in which the line widths of the voltage input wiring pattern 13a and the voltage output wiring pattern 13b are equal to or narrower than those of the wiring patterns 13c and 13d. Thus, heat radiation in the semiconductor package 1 in which the IC chip 3 including the driver transistor 3 is mounted on the leads 1a, 1b, 1c, and 1d using the flip chip bonding and is sealed with the resin can be improved.

Further, since the line widths of the voltage input wiring pattern 13a and the voltage output wiring pattern 13b are wider than those of other wiring patterns 13c and 13d on the printed circuit board 9, wiring resistance of the voltage input wiring pattern 13a and the voltage output wiring pattern 13b can be minimized, which minimizes voltage drop caused by wiring resistances of the wiring patterns 13a and 13b.

Further, in the semiconductor package 1, since the driver transistor 3f of the IC chip 3 is disposed in contact with an outer edge of the element arrangement region 3e, the heat generated in the driver transistor 3f can be more easily transmitted to the lateral faces of the encapsulating resin 7 of the semiconductor package 1, compared to a configuration in which the driver transistor of the IC chip is disposed not contacting the outer edge of the element arrangement region. Thus, heat radiation in the lateral faces of the encapsulating resin 7 can be improved in the semiconductor package 1.

Second Embodiment

Figure 8:
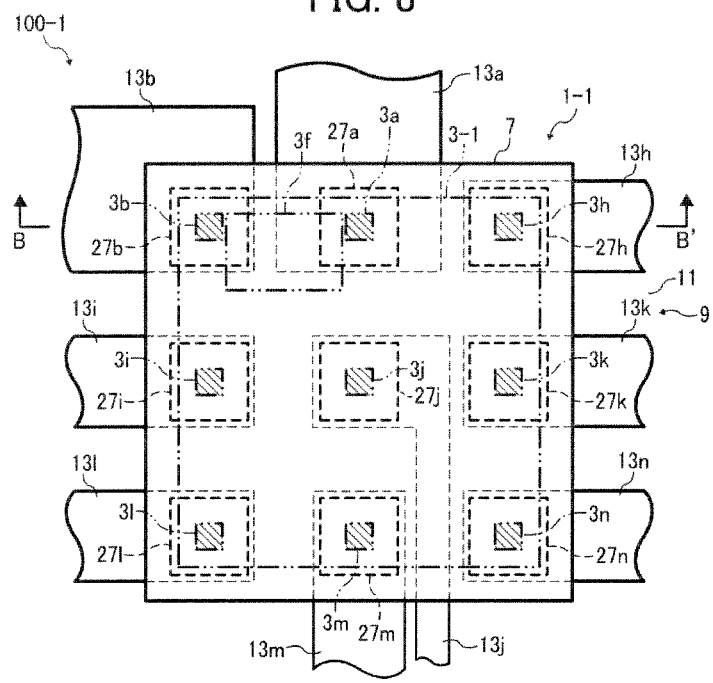
FIG. 8 is a plan view illustrating a semiconductor package in an electronic component package according to a second embodiment.
Figure 9:
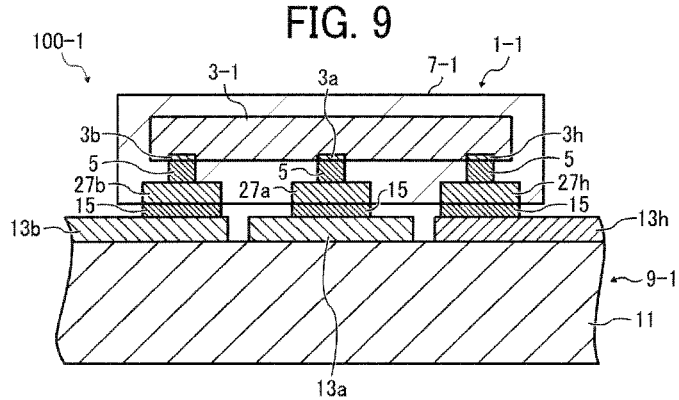
FIG. 9 is a cross-sectional diagram of the semiconductor package in the electronic component package along a line B-B' shown in FIG. 8.

Next, a semiconductor package 1-1 of a second embodiment is described below with reference to FIGS. 8 and 9. FIG. 8 is a plan view illustrating the semiconductor package 1-1 in an electronic component package 100-1 according to the second embodiment. In FIG. 8, a driver transistor formed in an IC chip 3-1 is represented by alternate long and short broken lines, and figures of the bumps and the solder are omitted. FIG. 9 is a cross-sectional diagram of the semiconductor package 1-1 in the electronic component package 100-1 along a line B-B' shown in FIG. 8. Components in electronic component package 100-1 operating similarly to the components in the electronic component package 100 in FIGS. 1 through 7 are represented by identical numerals in FIGS. 8 and 9.

In the semiconductor package 1-1, the IC chip 3-1 are mounted on nine electrically separated leads 27a, 27b, 27h, 27i, 27j, 27k, 27l, 27m, and 27n via the bump 5. The leads 27a, 27b, 27h, 27i, 27j, 27k, 27l, 27m, and 27n, collectively referred to as leads 27, are formed by electrotyping and do not include a so-called "suspender lead". Thus, the leads 27 can be formed so that film thicknesses of the leads are thinner than those of the leads in the lead frame that is formed by processing sheet metal. In the leads 27 formed by electrotyping, areas of the leads 27 in the IC chip mounting face (first face) are almost identical to areas of those in the exposure face (second face)(opposite to the IC chip mounting face) as illustrated in FIG. 9. The IC chip 3-1 includes nine pads 3a, 3b, 3h, 3i, 3j, 3k, 3l, 3m, and 3n and the driver transistor 3f formed in the element arrangement region (figure is omitted). The pad 3a functions as a voltage input pad to supply an input voltage to the driver transistor 3f. The pad 3b functions as a voltage output pad to which an output voltage from the driver transistor 3f is supplied.

The driver transistor 3f is disposed between the voltage input pad 3a and the voltage output pad 3b and is disposed in contact with an outer edge of the element arrangement region (not shown). In the present embodiment, the nine pads 3a, 3b, 3h, 3i, 3j, 3k, 3l, 3m, and 3n are arranged in an array of three columns and three rows. Excluding the pad 3j, the pads 3a, 3b, 3h, 3i, 3k, 3l, 3m, and 3n are arranged at edges of a pad array.

In the semiconductor package 1-1, the nine pads 3a, 3b, 3h, 3i, 3j, 3k, 3l, 3m and 3n are connected to the corresponding leads 27a, 27b, 27h, 27i, 27j, 27k, 27l, 27m, and 27n via the bump 5. In the present embodiment, the nine leads 27a, 27b, 27h, 27i, 27j, 27k, 27l, 27m, and 27n are arranged in an array of three columns and three rows. Therefore, excluding the lead 27j, the leads 27a, 27b, 27h, 27i, 27k, 27l, 27m, and 27n are arranged at edges of a lead array.

The leads 27a, 27b, 27h, 27i, 27j, 27k, 27l, 27m, and 27n, the IC chip 3-1, and bump 5 are sealed with encapsulating resin 7-1. The lead potions 27a, 27b, 27h, 27i, 27j, 27k, 27l, 27m, and 27n are exposed outside a backside face of the encapsulating resin 7-1 positioned opposite to the IC chip mounting face.

As illustrated in FIG. 9, the semiconductor package 1-1 is mounted on a printed circuit board 9-1, which forms the electronic component package 100-1. The printed circuit board 9-1 includes the insulative substrate 11 and wiring patterns 13a, 13b, 13h, 13i, 13j, 13k, 13l, 13m, and 13n.

Upper ends of the wiring patterns 13a, 13b, 13h, 13i, 13j, 13k, 13l, 13m, and 13n are disposed at positions corresponding to the leads 27a, 27b, 27h, 27i, 27j, 27k, 27l, 27m, and 27n. The leads 27a, 27b, 27h, 27i, 27j, 27k, 27l, 27m, and 27n are connected to the corresponding wiring patterns 13a, 13b, 13h, 13i, 13j, 13k, 13l, 13m, and 13n via the solder 15.

The line widths of the voltage input wiring pattern 13a that is connected to the voltage input lead 1a and the voltage output wiring pattern 13b that is connected to the voltage output lead 1b can be wider than those of other wiring patterns 13h, 13i, 13j, 13k, 13l, 13m, and 13n. The wiring pattern 13j connected to the lead 27j formed at a center position in the lead array of the semiconductor package 1-1 is guided to the outside of a mounting region of the semiconductor package 1-1 through a gap between the wiring patterns 13m and 13n, and therefore a line width of the wiring pattern 13j is narrower than those of other wiring patterns 13h, 13i, 13k, 13l, 13m, and 13n.

In the present embodiment, since the voltage input lead 27a and the voltage output lead 27b are provided at the edges of the lead array, in the printed circuit board 9-1 on which the semiconductor package 1-1 is mounted, the line widths of the voltage input wiring pattern 13a that is connected to the voltage input lead 27a and the voltage output wiring pattern 13b that is connected to the voltage output lead 27b can be wider than those of other wiring patterns 13h, 13i, 13j, 13k, 13l, 13m, and 13n.

As a comparative example, it is assumed that the driver transistor 3f is disposed between the pads 3j and 3b, the pad 3j functions as a voltage input pad, and the pad 27j functions as a voltage input pad in the IC chip 3-1. Since the wiring pattern 13j connected to the lead 27j is guided to the outside of the mounting region of the semiconductor package 1-1 through a gap between the wiring patterns 13m and 13n, the line width of the wiring pattern 13j cannot be wider. That is, if the lead pad 27j provided at the center position in the lead array of the semiconductor package 1-1 functions as the voltage input pad or the voltage output pad, the line width of the voltage input wiring pattern or the voltage output wiring pattern cannot be wider than those of other wiring patterns. By contrast, the IC chip 3-1 of the present embodiment can overcome this problem.

Since the line widths of the voltage input wiring pattern 13a and the voltage output wiring pattern 13b are wider than those of other wiring patterns 13h, 13i, 13j, 13k, 13l, 13m, and 13n on the printed circuit board 9-1, a heat generated in the driver transistor 3f can be effectively released via the voltage input pad 3a and the voltage output pad 3b, the voltage input lead 27a and the voltage output lead 27b, and the voltage input wiring pattern 13a and the voltage output wiring pattern 13b, compared to a configuration in which the line widths of the voltage input wiring pattern 13a and the voltage output wiring pattern 13b are equal to or narrower than those of the wiring patterns 13h, 13i, 13j, 13k, 13l, 13m, and 13n. Thus, the heat radiation in the semiconductor package 1-1 in which the IC chip 3-1 including the driver transistor 3f is mounted on the leads 27a, 27b, 27h, 27i, 27j, 27k, 27l, 27m, and 27n by the flip chip bonding and is sealed with the resin can be improved.

Further, since the line widths of the voltage input wiring pattern 13a and the voltage output wiring pattern 13b are wider than other wiring patterns 13h, 13i, 13j, 13k, 13l, 13m, and 13n on the printed circuit board 9-1, wiring resistance of the voltage input wiring pattern 13a and the voltage output wiring pattern 13b can be minimized, which minimizes voltage drop caused by wiring resistance of the wiring patterns 13a and 13b.

Further, in the semiconductor package 1-1, since the driver transistor 3f of the IC chip 3-1 is disposed in contact with the outer edge of the element arrangement region, the heat generated in the driver transistor 3f can be more easily transmitted to lateral faces of the encapsulating resin 7-1 of the semiconductor package 1-1, compared to the configuration in which the driver transistor 3f of the IC chip is disposed not contacting the outer edge of the element arrangement region. Thus, heat radiation in the lateral faces of the encapsulating resin 7-1 can be improved in the semiconductor package 1-1.

Third Embodiment

Figure 10:
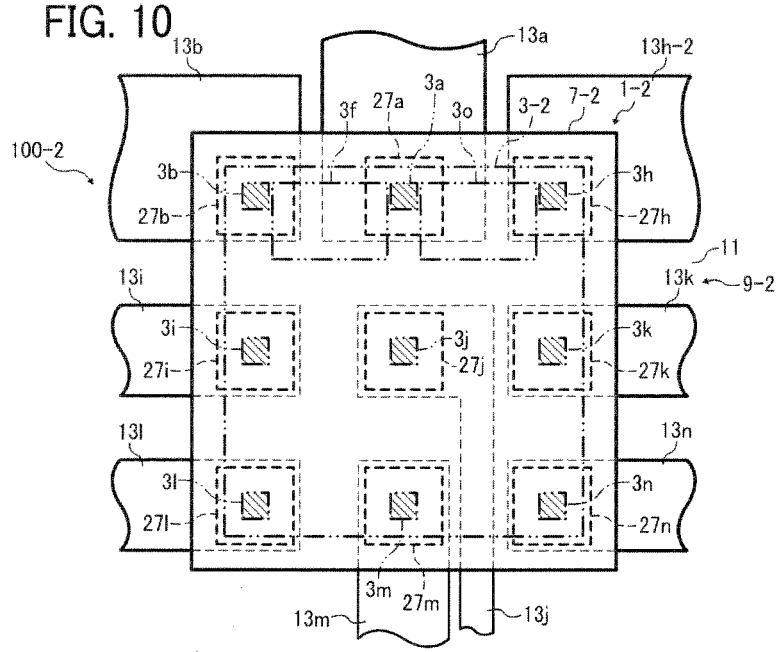
FIG. 10 is a plan view illustrating a semiconductor package in an electronic component package according to a third embodiment.

Next, a semiconductor package 1-2 according to a third embodiment is described below with reference to FIG. 10. FIG. 10 is a plan view illustrating the semiconductor package 1-2 in an electronic component package 100-2 according to the third embodiment. Components in the electronic component package 100-2 operating similarly to the components in the electronic component package 100-1 in FIGS. 8 and 9 are represented by identical numerals in FIG. 10. In the present embodiment, an IC chip 3-2 further includes a driver transistor 3o in addition to components included in the IC chip 3-1 shown in FIGS. 8 and 9.

The driver transistor 3o is disposed between the voltage input pad 3a and the pad 3h and is disposed in contact with an outer edge of the element arrangement region. The pad 3h functions as a voltage output pad to which an output voltage from the driver transistor 3o is supplied. The voltage input pad 3a is shared between the driver transistors 3f and 3o.

In a printed circuit board 9-2, a line width of a wiring pattern 13h-2 connected to the voltage output pad 3h is equal to that of the wiring pattern 13b and is wider than those of the wiring patterns 13i, 13j, 13k, 13l, 13m, and 13n.

The configuration of the third embodiment can achieve effects similar to those of the electronic component package 100-1 described above with reference to FIGS. 8 and 9. In addition, since the driver transistors 3f and 3o use the voltage input pad 3a and the voltage input lead 27 in common, the IC chip 3-2 and the semiconductor package 1-2 can be more compact than a configuration in which the voltage input pad and the voltage input lead are provided respectively for two adjacent driver transistors 3f and 3o. In the printed circuit board 9-2 on which the semiconductor package 1-2 is mounted, although two wiring patterns are required if the voltage input pads and the voltage input leads are provided for the two adjacent driver transistors 3f and 3o, respectively, in the present embodiment, since the voltage input pad 3a and the voltage input lead 27 are shared between the two adjacent driver transistors 3f and 3o, only a single voltage input wiring pattern is provided. Thus, the space for the wiring pattern for two voltage input wiring patterns can be eliminated and used instead for a wiring region. The voltage input wiring pattern 13a can be made wider, thereby improving heat radiation.

Fourth Embodiment

Figure 11:
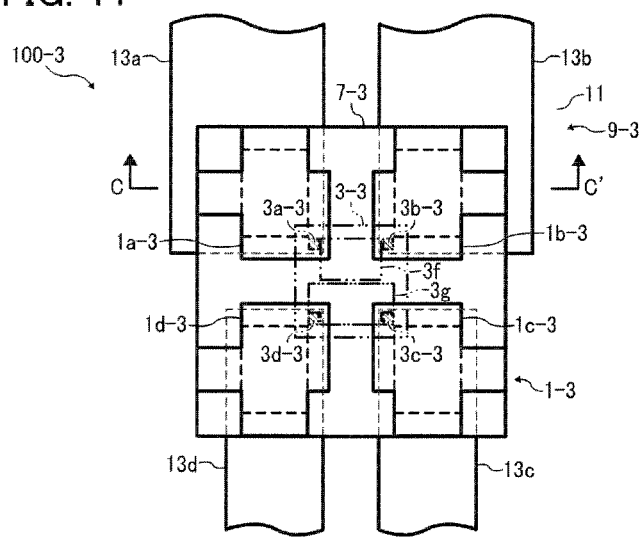
FIG. 11 is a plan view illustrating a semiconductor package in an electronic component package according to a forth embodiment.
Figure 12:
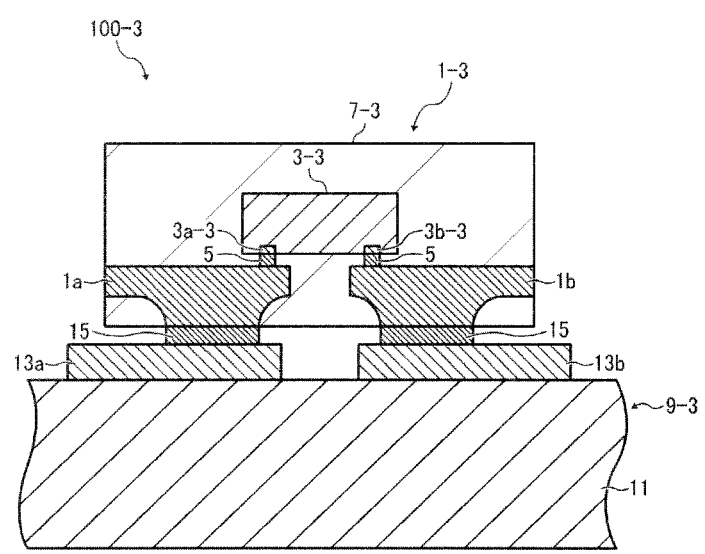
FIG. 12 is a cross-sectional diagram of the semiconductor package in the electronic component package along a line C-C' shown in FIG. 11.

Next, a semiconductor package 1-3 according to a fourth embodiment is described below. FIG. 11 is a plan view illustrating the semiconductor package 1-3 in an electronic component package 100-3 according to the forth embodiment. FIG. 12 is a cross-sectional diagram of the semiconductor package 1-3 in the electronic component package 100-3 along a line C-C' shown in FIG. 11. Components in electronic component package 100-3 operating similarly to the components in the electronic component package 100 in FIGS. 1 through 6 are represented by identical numerals in FIGS. 11 and 12.

A horizontal size of an IC chip 3-3 according to the present embodiment is smaller than that of the IC chip 3 according to the first embodiment shown in FIGS. 1 through 6, and an array pitch of the pads 3a-3, 3b-3, 3c-3, and 3d-3 is smaller than that of the leads 1a-3, 1b-3, 1c-3, and 1d-3 in the exposure face.

However, even if the horizontal size of the IC chip and the pitch of the array of the pads can be downsized so as to increase the number of IC chips cut from single wafer, the array pitch of the exposure face of the leads cannot be downsized due to layout limitations of the wiring pattern in the printed circuit board on which the semiconductor package is mounted.

In order to solve this problem, each of the leads 1*a*-3, 1*b*-3, 1*c*-3, and 1*d*-3 includes the first face on which the IC chip is mounted and the second face (exposure) opposite the first face, the first face has a surface area larger than the second face, that is, the first face has a surface area larger than the second face. The leads 1*a*-3, 1*b*-3, 1*c*-3, and 1*d*-3 in the IC chip mounting face are laid out so as to correspond the pads 3*a*-1, 3*b*-2, 3*c*-3, and 3*d*-3, such that the leads 1*a*-3, 1*b*-3, 1*c*-3, and 1*d*-3 in the IC chip mounting face are partially positioned beneath the pads 3*a*-3, 3*b*-3, 3*c*-3, and 3*d*-3, so that the IC chip 3-3 can be mounted on the leads 1*a*-3, 1*b*-3, 1*c*-3, and 1*d*-3 using the flip chip bonding.

In the present embodiment, the pads 3*a*-3, 3*b*-3, 3*c*-3, and 3*d*-3 are connected to the IC chip mounting face of the leads 1*a*-3, 1*b*-3, 1*c*-3, and 1*d*-3 via the bump 5, where layout positions of the pads 3*a*-3, 3*b*-3, 3*c*-3, and 3*d*-3 are entirely different from the layout positions of the leads 1*a*-3, 1*b*-3, 1*c*-3, and 1*d*-3 in the exposure face (second face). However, one, two, or three of the four pads 3*a*-3, 3*b*-3, 3*c*-3, and 3*d*-3 may be connected to the leads 1*a*-3, 1*b*-3, 1*c*-3, and 1*d*-3, where the layout positions of the pads 3*a*-3, 3*b*-3, 3*c*-3, and 3*d*-3 are different from that of the leads 1*a*-3, 1*b*-3, 1*c*-3, and 1*d*-3 in the exposure face (second face), and the other pad(s) may be connected to the leads where the pad(s) is superimposed on the layout position(s) of the lead(s) in the exposure faces (second face) when viewed from above.

Herein, although the semiconductor package having the four leads and the pads is described in the present embodiment, a configuration of a semiconductor package in which five or greater leads and pads are provided is similar to that of the semiconductor package 1-3. In this configuration, the semiconductor package includes at least one pad that is connected to the corresponding lead so that layout position of the pad is different from a layout position of the exposure face (second face) of the corresponding lead.

It is to be noted that the configuration of the present specification is not limited to that shown in FIGS. 1 through 12. The number, shape, arrangement, and circuit configuration of the electronic device are not limited to the above-described embodiments, and various modifications and improvements in the material and shape of the developer regulator are possible without departing from the spirit and scope of the present invention.

For example, in the first embodiment shown in FIGS. 1 through 7, the areas of the leads 1*a*, 1*b*, 1*c*, and 1*d* in the IC chip mounting face are greater than that in the exposure face. However, the configuration of the present specification is not limited to this embodiment, and the areas of the leads 1*a*, 1*b*, 1*c*, and 1*d* in the chip mounting face are equal to those in the exposure face. In addition, the leads formed by the electrotyping as described with reference to FIGS. 8 and 9 can be used in the semiconductor package 1 and 1-3 of the first and fourth embodiments shown in FIGS. 1 through 7 and 11 and 12. The lead formed by processing the metal plate as described with reference to FIGS. 1 through 7 can be used in the semiconductor package 1-1 and 1-2 in the second and third embodiments shown in FIGS. 8 through 10.

In the above-described embodiments, although the power supply IC including the voltage regulator is described as the IC chip installed in the semiconductor package, the IC chip in the present disclosure is not limited to this IC. The IC chip installed in the semiconductor package in the present specification can be adapted to an IC having any function including a driver transistor.

In addition, although the semiconductor package adapts a leadless type package, the semiconductor package of the present disclosure can be adapted to a semiconductor package in which leads are projected from an encapsulating resin.

Numerous additional modifications and variations are possible in light of the above teachings. It is therefore to be understood that, within the scope of the appended claims, the disclosure of this patent specification may be practiced otherwise than as specifically described herein.

What is claimed is:

1. A semiconductor package assembled with flip chip bonding and sealed with resin, comprising:
    an IC chip comprising:
        an element arrangement region;
        a pad array having at least four pads including a voltage input pad to supply an input voltage and a voltage output pad to which an output voltage is supplied, the voltage input pad and the voltage output pad being disposed at edges of the pad array;
        a driver transistor disposed between the voltage input pad and the voltage output pad to receive the input voltage from the voltage input pad and output the output voltage to the voltage output pad, the driver transistor being disposed in contact with an edge of the element arrangement region; and
    at least four leads on which the IC chip is mounted by the flip chip bonding to be formed in a lead array, the leads being disposed corresponding to the pads in the pad array,
    the leads including a voltage input lead electrically connected to the voltage input pad and a voltage output lead electrically connected to the voltage output pad,
    the voltage input lead and the voltage output lead being disposed at edges of the lead array.

2. The semiconductor package according to claim 1, wherein the pads in the pad array and the leads in the lead array are arranged in an array consisting of at least three rows and three columns.

3. The semiconductor package according to claim 1, wherein the IC chip further comprises at least two driver transistors and the voltage input pad is shared between any two adjacent two driver transistors.

4. The semiconductor package according to claim 1, wherein the lead comprises a first face on which the IC chip is mounted and a second face opposite the first face, the first face has a surface area larger than the second face.

5. The semiconductor package according to claim 4, wherein the semiconductor package comprises at least one pad whose layout position is different from a layout position of the second face of the corresponding lead.

6. An electronic component package comprising:
    a printed circuit board having at least four wiring patterns; and
    a semiconductor package mounted on the printed circuit board by flip chip bonding and sealed with resin,
    the semiconductor package comprising:
        an IC chip comprising:
            an element arrangement region;
            a pad array having at least four pads, the pads including a voltage input pad to supply an input voltage and a voltage output pad to which an output voltage is supplied, the voltage input pad and the voltage output pad being disposed at edges of the pad array; and
            a driver transistor disposed between the voltage input pad and the voltage output pad to receive the input voltage from the voltage input pad and output the output voltage to the voltage output pad, the driver transistor being disposed in contact with an edge of the element arrangement region; and at least four leads on which the IC chip is mounted by the flip chip bonding, disposed corresponding to the pads in the pad array, formed in a lead array, the leads including a voltage input lead electrically connected to the voltage input pad and a voltage output lead electrically connected to the voltage output pad, the voltage input lead and the voltage output lead being disposed at edges of the lead array.

7. The electronic component package according to claim 6, wherein the wiring patterns have a voltage input wiring pattern electrically connected to the voltage input lead and a voltage output wiring pattern electrically connected to the voltage output lead, and the voltage input wiring pattern and the voltage output wiring pattern have line widths that are wider than line widths of other wiring patterns.

* * * * *